(12) United States Patent
Kay

(10) Patent No.: US 8,458,395 B2
(45) Date of Patent: Jun. 4, 2013

(54) SOLID STATE MEMORY DRIVE AND METHOD FOR RECEIVING AND COUPLING WITH CASSETTE DRIVE BAYS

(75) Inventor: Robert Kay, Temecula, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 476 days.

(21) Appl. No.: 12/508,249

(22) Filed: Jul. 23, 2009

(65) Prior Publication Data

US 2011/0022792 A1 Jan. 27, 2011

(51) Int. Cl.
*G06F 13/00* (2006.01)
(52) U.S. Cl.
USPC .......................................... 711/111; 711/154
(58) Field of Classification Search
USPC .................................................. 711/111, 154
See application file for complete search history.

(56) References Cited

U.S. PATENT DOCUMENTS

| 5,131,089 A | 7/1992 | Cole |
| 7,181,560 B1 * | 2/2007 | Grand et al. .................. 710/300 |
| 2006/0190205 A1 * | 8/2006 | Klein et al. .................. 702/115 |

* cited by examiner

*Primary Examiner* — Reba I Elmore
(74) *Attorney, Agent, or Firm* — Sony Corporation

(57) ABSTRACT

A solid state memory drive includes a first interface for receiving solid state memory cartridges; and a second interface for communicatively coupling the solid state memory drive unit with a host system through a drive bay configured to house a cassette tape drive. A host system then includes at least one drive bay configured to receive either the solid state memory drive or a tape cassette drive. A method includes removing a magnetic tape cassette drive from the drive bay; and inserting a solid state memory cartridge drive into the drive bay so as to communicatively interface the solid state memory cartridge drive and the host system.

18 Claims, 7 Drawing Sheets

US 8,458,395 B2

SOLID STATE MEMORY DRIVE AND METHOD FOR RECEIVING AND COUPLING WITH CASSETTE DRIVE BAYS

BACKGROUND

Many computer systems have their data backed up on a regular basis. It is very common for enterprise systems to backup their electronic data weekly, daily, or sometimes even hourly. Data libraries often employ backup systems for storing large amounts of electronic data.

One type of media which has been used for backing up electronic data is a magnetic tape drive system. A magnetic tape drive system typically comprises a cartridge or cassette containing a magnetic tape wound around two reels. A cassette interface unit connected to a computer system is designed to read and write to the magnetic tape inside an inserted cassette. An advantage of using a tape drive is that vast amounts of data can be stored at a relatively inexpensive cost. Tape drives are also common in the consumer market as many people wish to backup their electronic data in case of a system failure.

However, because magnetic tape systems involve a lot of moving mechanical part, they use more power and are more prone to environmental contamination or mechanical failure. Another disadvantage of a tape drive is that memory access is sequential, as opposed to most memory devices which offer random access. Due to these characteristics, tape drives are best suited for backup and archiving processes.

Another form of memory media which is becoming more common is solid state, for example, Flash memory. Solid state technology has allowed for smaller memory modules with no moving mechanical parts and fast random read/write access. Solid state drives come in many small forms, such as Secure Digital (SD) cards which fit into small consumer electronic devices such as cameras and cell-phones and Universal Serial Bus (USB) drives.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
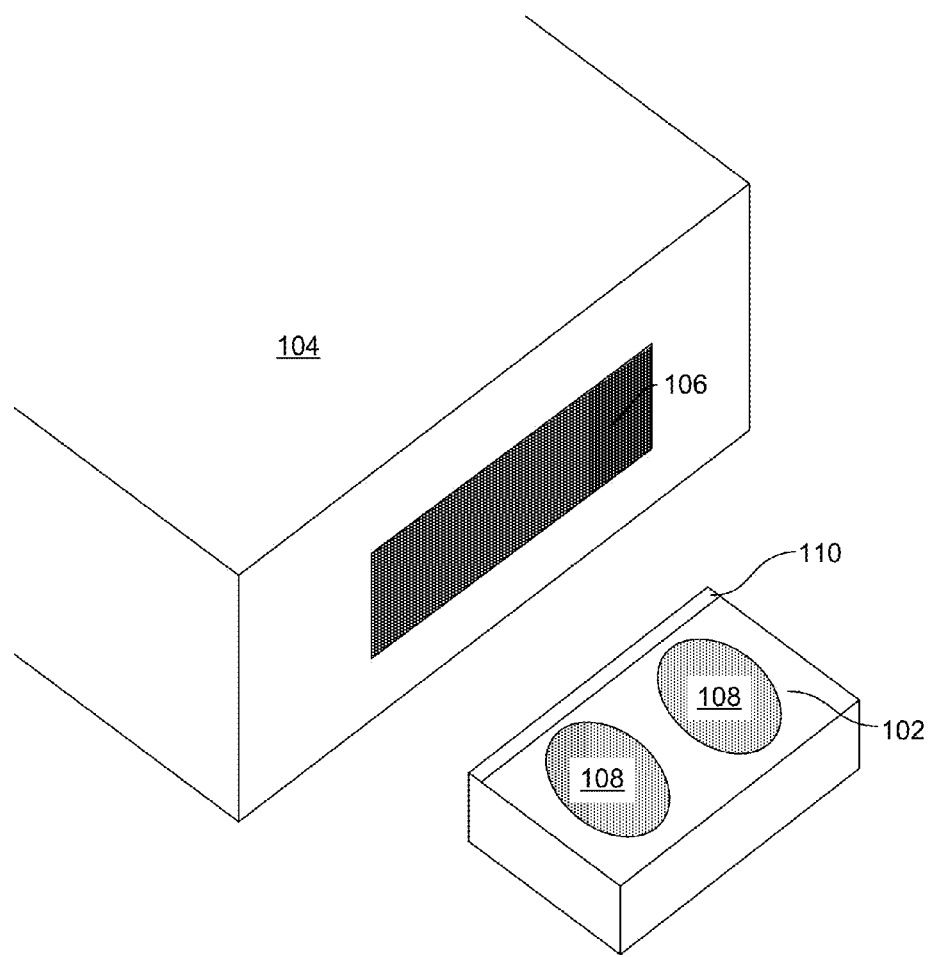
FIG. 1 is an illustrative isometric view of an exemplary tape drive system, according to one embodiment of principles described herein.

As mentioned above, magnetic tape drive systems are often employed by data libraries and other commercial entities which regularly backup large amounts of electronic data. Magnetic tape drives are also provided for consumers, allowing them to back up important data from their systems such as music, video, and image files. Magnetic tape drives may also be used to back up a number of other types of data. A single tape drive cassette can often store hundreds or even thousands of gigabytes (GB) of data.

The present specification describes the placement of solid state memory technologies into cartridges with dimensions similar to those of magnetic tape cassettes typically used for backup solutions. The cassette drive unit which normally houses the components to read the magnetic tape inside the tape cartridges is replaced with a drive unit containing components which will interface the solid state components inside the solid state cartridge with an external or host system.

Through use of this innovation, users can upgrade their tape backup systems to a solid state cartridge system and will not need to make any changes to their archiving methods. They may use the same racking and storage equipment for the new solid state cartridges which they used previously for magnetic tape cassettes. The archival or drive management software designed for use with the new solid state drives can have the same graphical user interface (GUI) as the software designed for the older magnetic tape drive backup systems. In some cases, the drive unit can be designed to emulate the magnetic tape drive unit. This will make it so that no changes need to be made to any archival software which originally used the magnetic tape drive system. Thus, users will not have to adapt to a new piece of software or alter their routine archiving processes.

Using solid state devices rather than magnetic tape consumes less power. Tape drives require more energy as the mechanical moving parts including the reels holding the magnetic tape can take a fair amount of energy to move. Solid state devices contain no moving parts and therefore no mechanical energy is needed to rotate reels or move actuator arms. Only a small amount of electrical energy is used for reading or writing to a solid state device. In addition, the elimination of moving parts introduced by the replacing of magnetic tape cassettes with solid state cartridges provides more reliability.

Using solid state devices rather than magnetic tape will also produce faster performance for both reading and writing. Solid state devices offer fast random access, thus any section of the data stored on the cartridge may be immediately accessed. A magnetic tape device only offers sequential reading and writing, meaning that if one desires to access a certain section of data stored on a tape drive, there is quite a long seek time as the reels need to be rotated until the section containing the desired data is accessible to the reading components in the interface unit.

A solid state drive system embodying principles described herein may be used in both data library backup systems as well as consumer data storage systems. As used herein and in the appended claims, the term "solid state" with reference to memory devices, memory components or data storage cartridges will be defined as referring to memory devices, whether currently known or developed in the future, that require no mechanical action or moving parts, including, but not limited to, Flash or semiconductor memory, organic memory and any other form of memory that does not need mechanical action or moving parts.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Throughout this specification and in the appended claims, the term "solid state cartridge" will refer to a cartridge or cassette containing solid state data storage technology. The term "solid state cartridge interface unit" will refer to any device used to interface the solid state memory components of a solid state cartridge with a computer or other device that will make use of the data on the cartridge. In addition, the term "solid state system," or "solid state drive system" will refer to a system using both a solid state cartridge interface unit, solid state cartridge and may possibly include other components involved in the solid state data storage system. The terms "cassette" and "cassette interface unit" will refer to components of a magnetic tape drive system. Throughout this specification, the term "cartridge" differs from the term "cassette" in that a cartridge houses solid state components while a cassette houses magnetic tape.

As used herein and in the appended claims, the term "host system" will refer to any system that utilizes a cartridge or cassette drive to store or retrieve data. For example, a host system may include, but is not limited to, a personal computer, server, multi-cassette library unit, laptop or other computerized or processor-driven device.

FIG. 1 is an illustrative isometric view of an exemplary tape drive system (100). As mentioned above, a typical tape drive system comprises a cassette (102) having magnetic tape wound around two reels (108). The cassette (102) is designed to fit into a magnetic tape cassette drive (104). The magnetic tape cassette drive (104) has an opening (106) that matches the dimensions of the cartridge (102). Components inside the cassette drive (104) are designed to open the edge (110) of the cassette and access the magnetic tape for reading and writing electronic data.

The cassette drive (104) is designed to fit into a drive bay. A drive bay is an opening in a computer system chassis used for placement of various system drives such as a Compact Disc (CD) drive or a Hard Disk Drive (HDD). Drive bays may be of different sizes depending on the system employing them. For example, drive bays in consumer computer systems may be smaller than drive bays used by enterprise systems.

Through use of this tape drive system (100), a cassette (102) may be inserted into the cassette drive (104). The computer system interfacing with the cassette drive (104) may then transfer electronic data from any other memory media to and from the inserted cassette (102). The data which is transferred may be system data or any type of electronic data a user may wish to archive or back up. Depending on the tape drive system (100) and the amount of electronic data needing to be transferred, the process may take minutes or hours.

Figure 2:
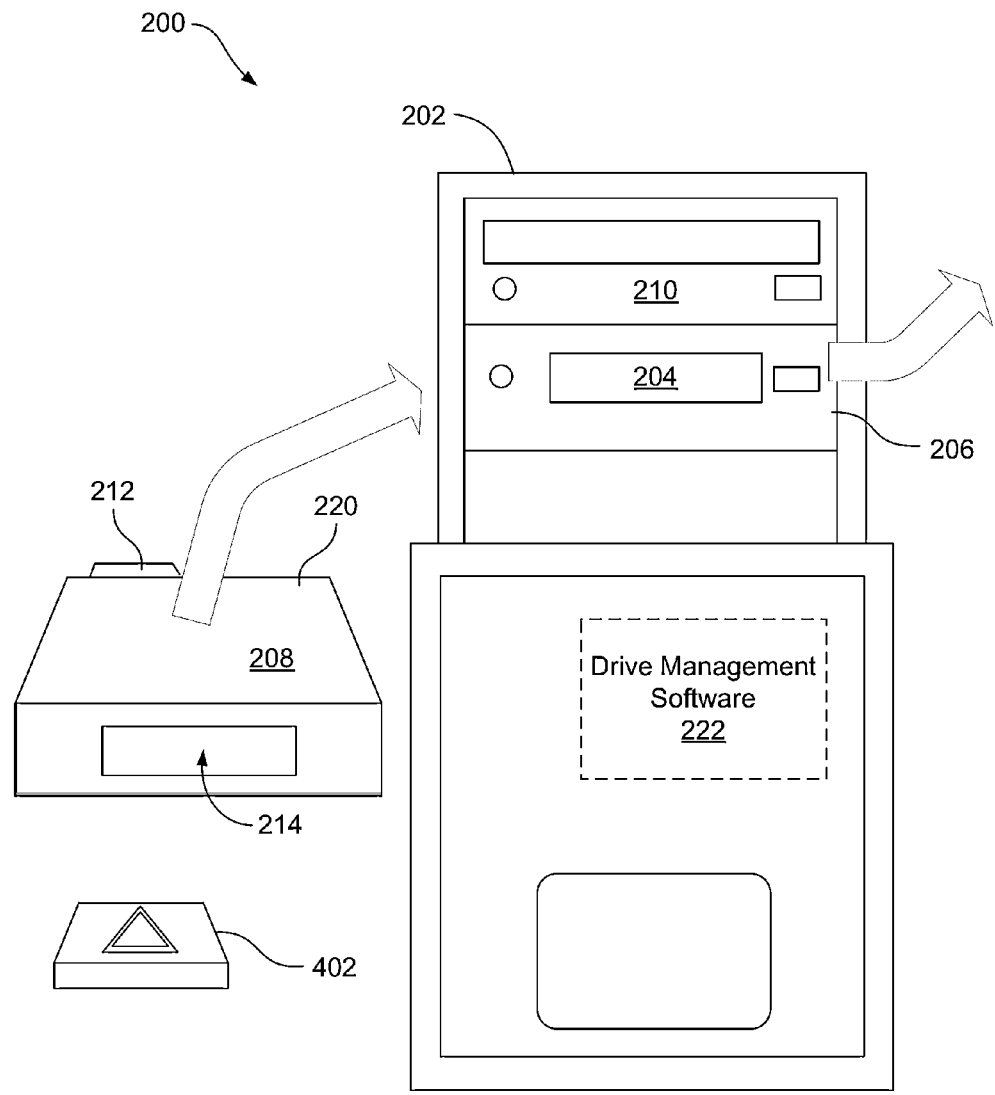
FIG. 2 is an illustrative front view of an exemplary computer system housing a cartridge interface unit for a cartridge or cassette, according to one embodiment of principles described herein.

FIG. 2 is an illustrative front view of an exemplary computer or host system (200) housing a cartridge interface unit or a cassette interface unit. Many computer systems including enterprise server systems and consumer desktop systems may make use of a tape drive system. In a typical consumer desktop system (202), a CD or Digital Video Disc (DVD) drive (210) is placed into one of the drive bays and integrated with the system (202). If the system (202) employs a tape drive system (204), the tape cartridge drive (104, FIG. 1) will be incorporated into the system in a fashion similar to that of a CD or DVD drive (210). Specifically, a tape drive (204) will be housed in a drive bay (206) of the system (202).

In one embodiment of the present invention, the tape drive (204) is removed from the drive bay (206) as indicated by the arrow on the right of FIG. 2. A solid state cartridge drive unit (208) may then be placed in the drive bay (206) which was previously occupied by the tape drive unit (204). This is indicated by the arrow on the left of FIG. 2.

The solid state cartridge drive unit (208) includes an interface (212) that is configured to communicatively couple the drive (208) into the bay (206) and the computer system (200). This interface (212) may be designed to match a similar interface on the cassette tape drive (204) so as to allow the solid state cartridge drive (208) to replace the cassette tape drive (204) in the bay (206). Additionally, the solid state cartridge drive (208) may include a housing (220) that is sized to fit in the drive bay (206) that previously accommodated the cassette tape drive (204).

The solid state cartridge drive (208) also includes another interface (214) for receiving a solid state memory cartridge (402). When the cartridge (402) and drive (208) are connected via the interface (214), data can be read from, or written to, the solid state memory cartridge (402) by the system (200) through the drive (208).

A user may then replace their magnetic tape cassettes with solid state cartridges. The solid state cartridges can be designed to have the same general look and feel, thus users will not notice any real changes to their system. They may also use the same racking and storage equipment for the new solid state cartridges which they used previously for magnetic tape cassettes.

As noted above, the archival or drive management software (222) designed for use with the new solid state drives can have the same graphical user interface (GUI) as the software designed for the older magnetic tape drive backup systems. In some cases, the drive unit (208) can be designed to emulate the magnetic tape drive unit such that the same drive management software (222) used with the previous tape drive can still be used with the new solid state cartridge drive (208). This will make it so that no changes need to be made to any drive management software (222) which originally used the magnetic tape drive system. Thus, users will not have to adapt to a new piece of software or alter their routine archiving processes.

Enterprise systems often contain multiple tape drive units used for backup. In one embodiment, all of the tape drives could be removed from their respective drive bays and replaced with the solid state drive units. All of the magnetic tape cassettes would then be replaced with solid state cartridges. Due to the large amount of data required for enterprise systems, a large number of magnetic tape cassettes are used. These cassettes are typically stored on racking or other storage equipment that is designed to hold cassettes of a specific size. By using a solid state cartridge with similar dimensions to those of the magnetic tape cassettes previously used, users will not need to make any changes to their storage and organizational systems.

As mentioned above, according to one illustrative embodiment, a magnetic tape sized cartridge may actually employ solid state memory technologies. A solid state cartridge may contain any type of solid state memory devices which will fit into a cartridge with similar size to a magnetic tape cassette. Either NOR flash or NAND flash memory may be used. Solid state memory devices are a form of non-volatile memory. Thus, they retain their data when there is no power being supplied. Due to the non-volatile nature of solid state memory devices, they are ideal for removable memory storage and backup solutions.

Figure 3A:
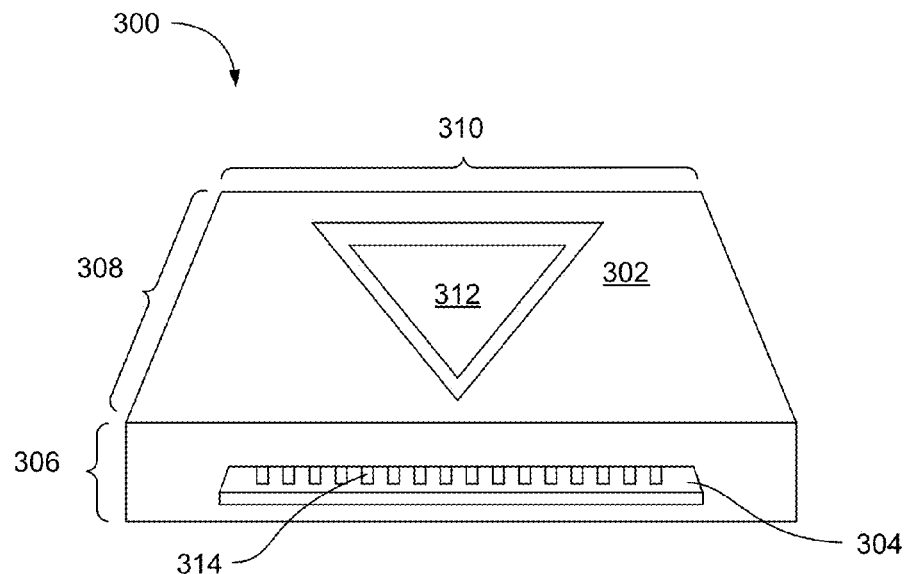
FIG. 3A is an illustrative depiction of a cartridge embodying solid state components, according to one embodiment of principles described herein.

FIG. 3A is an illustrative depiction of a cartridge (300) which contains solid state components. The cartridge housing (302) may be made of any material that is typical for use in memory housing devices. The material needs to be able to handle the temperatures involved in standard memory operation. The material is typically a dielectric or non-conducting material so as not to interfere with the electrical operation of the device. The housing material (302) may be of any color and may contain any type of design or logo (312). It may be possible to customize the design of the cartridge to a user's personal preferences. The cartridge may be of any width (310), depth (308), or height (306) that will allow it to fit into a corresponding drive and to hold a sufficient amount of solid state memory circuitry. In one embodiment, the solid state memory cartridge could be the same size as Sony's Advanced Intelligent Tape (AIT) cartridges which are 95 mm×62 mm×15 mm. Other embodiments could be sizes equivalent to Sony DDS cartridges which are 73 mm×53 mm×10 mm, or Sony SAIT cartridges which are 105 mm×101 mm×20 mm.

In one embodiment, a solid state cartridge could include a protrusion (304) containing electrical contacts (314). These electrical contacts could be designed to interface with the drive (104, FIG. 1) so as to transfer data between the drive (104, FIG. 1) and the solid state memory unit or units contained within the cartridge (300). Any method or protocol as appreciated by those skilled in the relevant art may be used to transfer electrical data between the cartridge (300) and the cartridge interface unit through the electrical contacts (314).

Figure 3B:
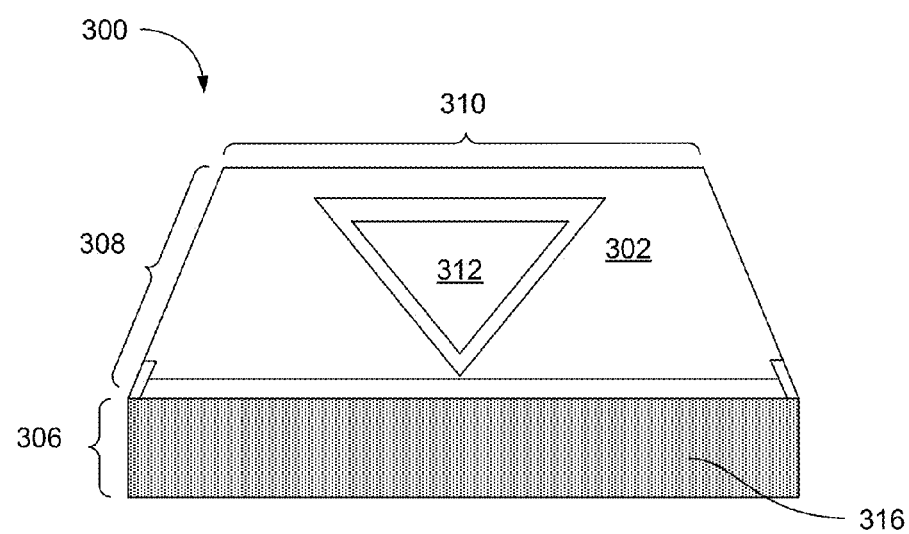
FIG. 3B is an illustrative depiction of a cartridge embodying solid state components, according to one embodiment of principles described herein.

According to one illustrative embodiment as shown in FIG. 3B, the solid state memory cartridge (300) could include a movable member such as a hinged gate (316) which may shield any electrical contacts underneath from any wear or damage which may occur. Upon insertion into a solid state cartridge drive unit (104, FIG. 1), the gate (316) would be mechanically moved to a position which would allow components of the drive unit (104, FIG. 1) to make electrical contact with the cartridge (300). In this way, the gate (316) would be similar to the cover that protects the tape within a cassette, and a tape drive will already be configured to lift such a gate (316) or cover in order to access the data on the cartridge (300). Other interface methods including but not limited to Radio Frequency (RF) or inductive methods may be used as well.

Figure 4A:
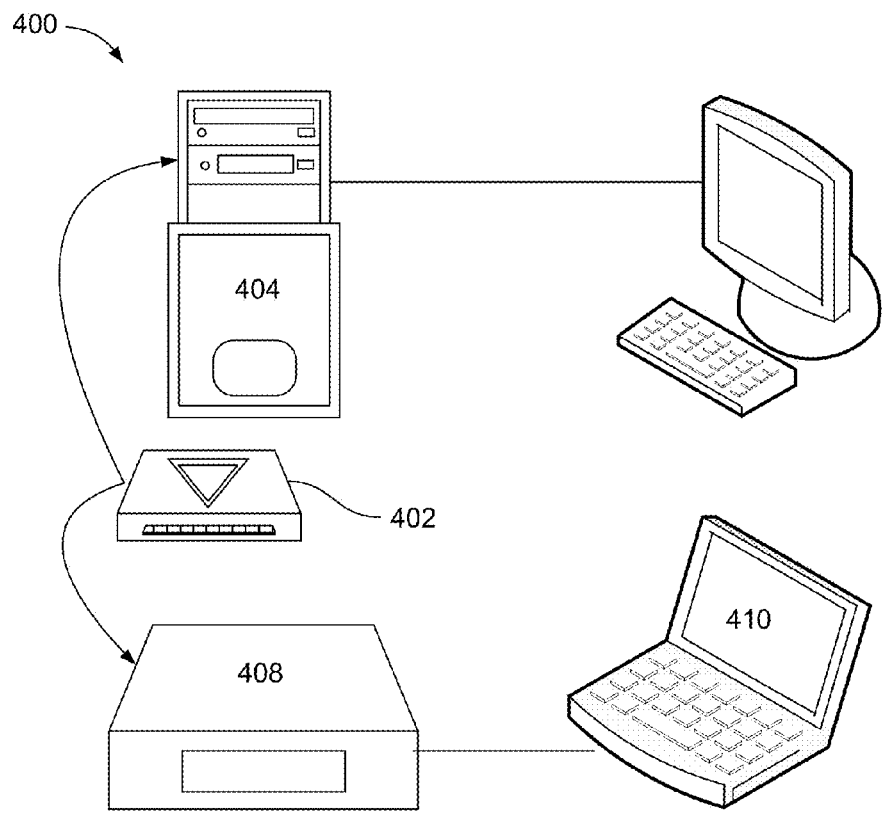
FIG. 4A is an illustrative diagram showing possible uses for a solid state drive system, according to one embodiment of principles described herein.

FIG. 4 is an illustrative diagram (400) showing possible uses for a solid state drive system. As mentioned above, the magnetic tape drive units occupying a drive bay of a consumer desktop system (404) may be replaced by solid state drive units. A solid state cartridge (402) may then be used for data storage.

Magnetic tape drive backup systems may also come in the form of an external drive. These types of magnetic tape drives may be replaced with a similar sized external solid state drive (408). This external solid state drive unit may be able to interface with any host system. For example, the external solid state drive (408) could be connected to a laptop (410). These external solid state drives can be made to have similar dimensions as the external magnetic tape backup drive. Users may then go about using the same archiving or backup processes without any change to their routine.

Figure 4B:
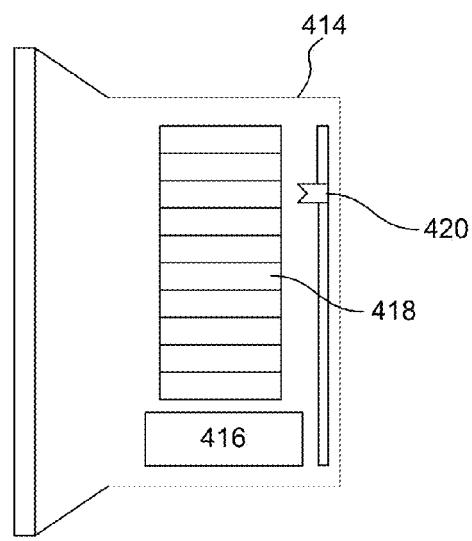
FIG. 4B is an illustrative diagram of a tape library which may employ solid state technology, according to one embodiment of principles described herein.

FIG. 4B is an illustrative diagram of a tape library (414) which may employ solid state technology. A tape library is a self contained unit which houses a set of magnetic tape cassettes (418) and a robotic arm (420) to retrieve the cassettes and place them into a cassette drive (416). Some tape library units have more than one cassette drive (416). A tape library unit (414) is designed to connect to a host system through an interface and transfer data between the host system and the library unit (414). According to one embodiment, the cassette drive (416) of a tape library unit could be replaced with a solid state drive and the cassette tapes (418) could be replaced with solid state memory cartridges (402). By using solid state cartridges with similar dimensions as the cassette tapes, it is not necessary for customers using tape library units to purchase whole new units. The new solid state drives will fit into place where the cassette drive (416) was stored previously, and the solid state cartridges will fit into the cassette tape slots and be able to be retrieved by the robotic arm (420) for insertion into the solid state drive.

Different solid state cartridges may be customized for different settings. Some may contain slower solid state memory but contain large amounts of memory storage space. These types of cartridges would be suited to backup processes.

Other customizations could include a cartridge with a relatively small amount of storage space but offer faster memory. These types of cartridges would be suited for quick transfer of data between systems. For example, a user could use this type of cartridge to store some music files for immediate use on a stereo system. In one embodiment, the solid state cartridge could include a small section of very fast memory to be used for caching purposes. Another possible customization involves how often data can be written to a particular memory location. Higher write counts generally require more expensive memory devices. The memory used could be customized depending on the intended application of a particular memory cartridge. Additionally, data management techniques within the memory cartridge and interface device could be utilized to optimize the reliability of the memory used.

Figure 5:
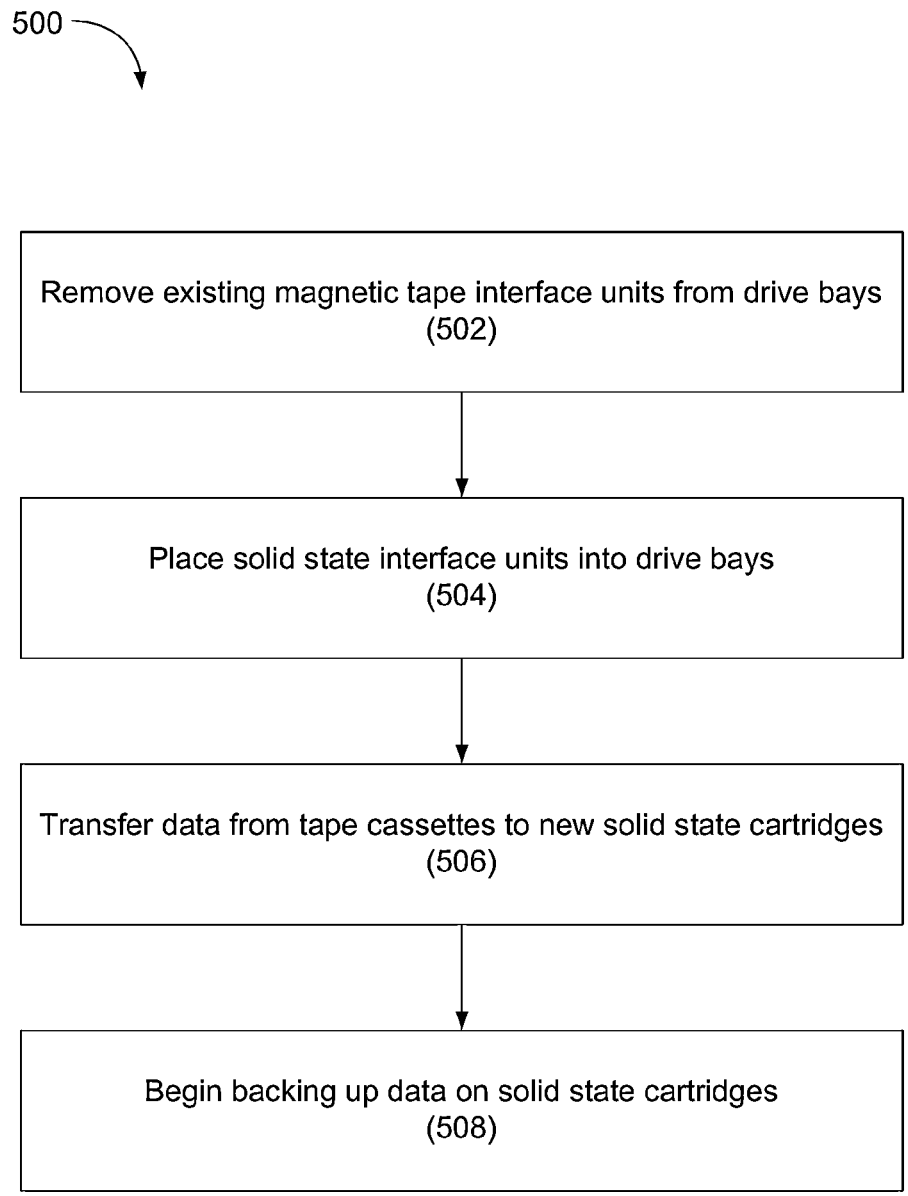
FIG. 5 is an illustrative flow chart depicting an exemplary upgrade process from tape drives to solid state drives, according to one embodiment of principles described herein.

FIG. 5 is an illustrative flow chart (500) depicting an exemplary upgrade process from tape drives to solid state drives. As mentioned above, there are several advantages to using solid state cartridges as opposed to magnetic tape cassettes. Solid state cartridges offer faster, quieter, more reliable data storage.

However, many users of tape backup systems do not wish to change their backup process. It can be costly and time consuming for enterprise entities to set up a new system for archiving electronic data and to train archiving personnel to operate the new system.

By using solid state cartridges similar in size and shape to the magnetic tape cassettes, no major changes in the backup process will need to occur. The software used to operate the backup hardware may use the same user interface, thus users will need to make no changes to their backup process.

The first step that will need to occur when upgrading is to remove all of the magnetic tape drives from their drive bays (502). Next, solid state cartridge drive units will need to be placed into the recently vacated drive bays (504).

If desired, data stored on previous magnetic tapes can be transferred to the new solid state cartridges (506). This can be done through a variety of means as will be appreciated by those skilled in the relevant art. Once the interface units have been replaced, users may then begin backing up or archiving electronic data on the new solid state cartridges (508).

Figure 6:
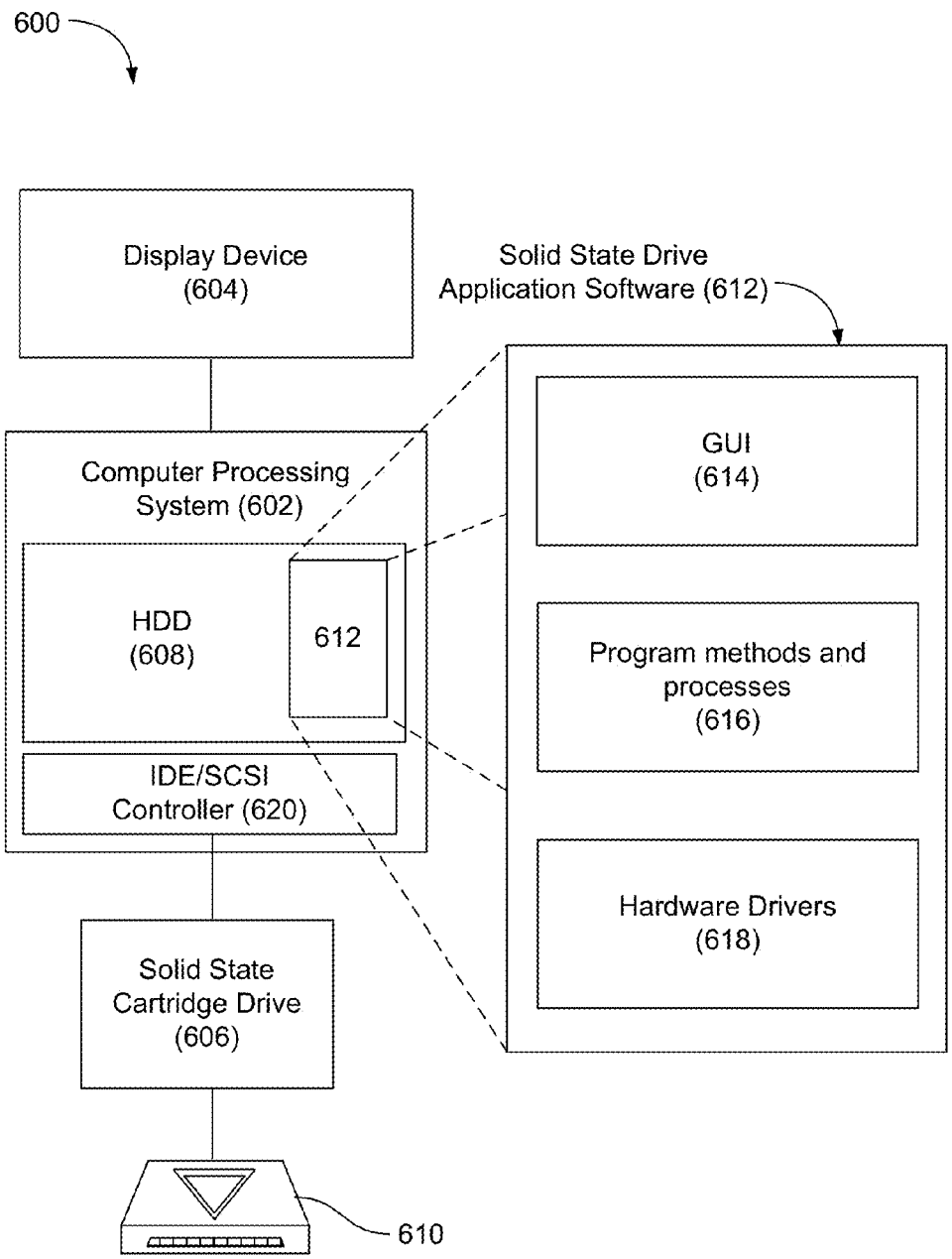
FIG. 6 is an illustrative diagram depicting an exemplary software application designed to operate a solid state memory cartridge system installed on a computer system, according to one embodiment of principles described herein.

FIG. 6 is an illustrative diagram (600) depicting an exemplary software application (612) designed to operate a solid state memory cartridge system installed on a computer system. In one embodiment, the solid state cartridge drive (606) could be connected to an Integrated Drive Electronics (IDE) or SCSI controller (620) of a computer processing system (602). Other interfaces may be used including but not limited to Serial Advanced Technology Attachment (SATA) and Firewire. The solid state drive system application software (612) can be stored on the local Hard Disk Drive (HDD) of the computer processing system (602).

In one embodiment, the solid state drive system application software (612) may comprise a GUI (614), program methods and processes (616), and hardware drivers (618). The GUI allows a user to interface with the solid state system hardware through the software application (612). A user may use the interface to view the contents, including information related to the cartridge itself (such as identification or available memory capacity, etc) of a solid state cartridge (610) currently inserted into the solid state cartridge interface unit (606). A user may also use the GUI (614) to transfer data to and from the inserted solid state cartridge (610). The GUI (614) may provide the user with operations to regularly backup previously specified files or folders stored on the local hard disk drive (608). The GUI may be displayed to a user through a display device (604) attached to the computer processing system (602).

The program methods and processes (616) comprise all of the algorithms and coding necessary to execute the various functions associated with the software application (612). These algorithms may be designed for several functions. For example, an algorithm for compressing data stored on the hard disk drive (608) and transferring it to the solid state cartridge (610) could be used. Many algorithms and program code designed to accomplish other necessary and optional application functions may also be included. A detailed description of which will not be given here.

The hardware drivers (618) allow the higher level program code of the application to interact with the solid state drive system hardware. Device drivers must be designed for use with specific hardware and the specific operating system of the computer processing system (602) for which the hardware is connected to. Device drivers are well known in the art, thus a detailed description thereof will not be given.

In one embodiment, the solid state drive hardware can be designed to emulate the magnetic tape drive unit for which the solid state drive is a direct replacement. By doing so, any archiving or interactive software with the device will not need to replaced. The user could use the software originally designed to operate the magnetic tape drive and not need to install or relearn any new software.

Figure 7:
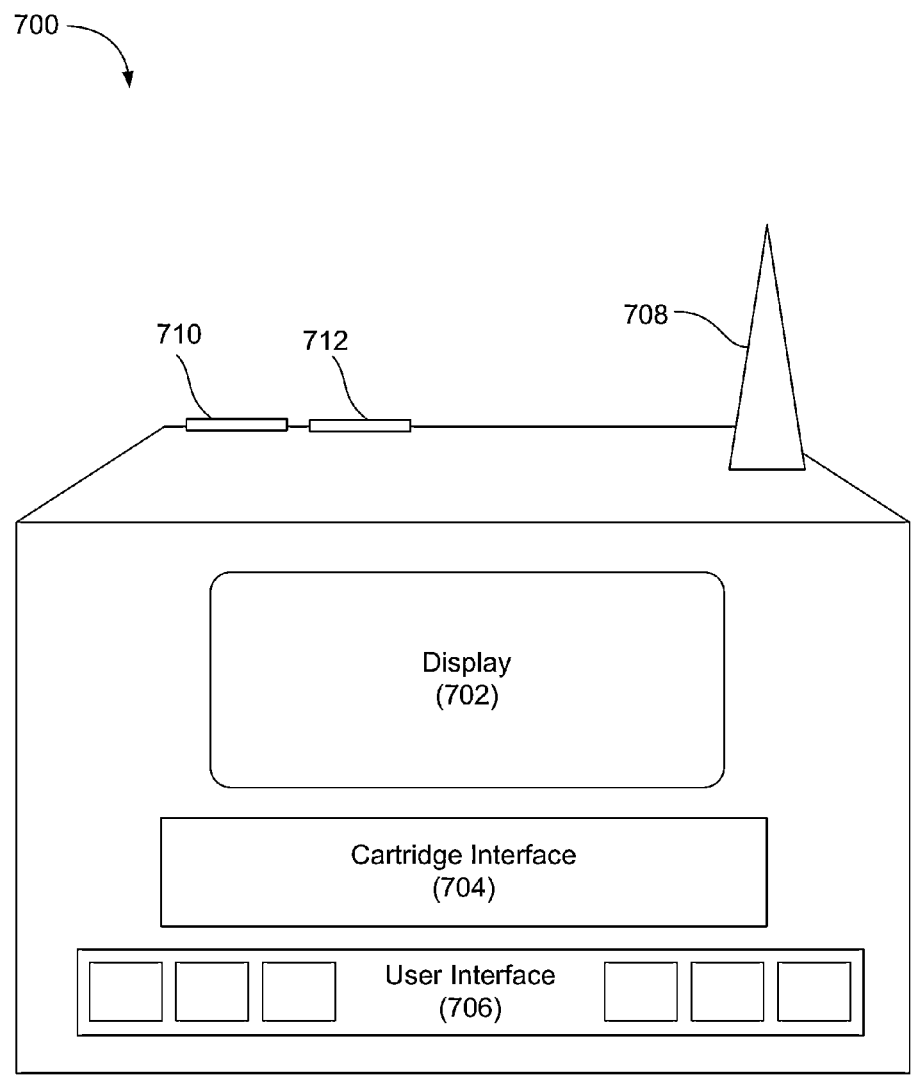
FIG. 7 is an illustrative diagram depicting an exemplary standalone unit having a solid state cartridge interface, according to one embodiment of principles described herein.

FIG. 7 is an illustrative diagram depicting an exemplary standalone unit (700) having a solid state cartridge interface (704). In one embodiment a standalone device may include a display (702), a solid state cartridge interface (704), a user interface (706), a wireless networking adapter (708), a power supply port (710), and an Ethernet port (712). A solid state memory cartridge may be inserted into the cartridge interface (704). The standalone device (700) may be capable of reading the contents on the inserted cartridge and displaying information to a user through the display (702). The displayed information could include information such as a list of the files stored on the cartridge, total capacity, and used storage space. A user may interact with the device (700) through a user interface (706) which may contain buttons and other controls. The device (700) could be battery powered and/or receive power from an external source through a power port (710). The device (700) may be connected with a data network through an Ethernet port (712) or a wireless networking adapter (708). The connection to a network may allow data to be transferred between an inserted solid state cartridge and other storage media connected to the data network. In sum, a cartridge having similar dimensions as a magnetic tape cassette contains solid state memory components instead of magnetic tape and reels. A solid state cartridge interface unit is designed to interface with any computer system. The computer system may then transfer electronic data to and from the solid state cartridge.

The use of solid state memory components instead of magnetic tape components provides several benefits. Solid state devices offer random access as opposed to the sequential access provided by magnetic tape drive systems. Solid state devices are void of any moving components, thus they consume less power and are more reliable.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A solid state memory drive comprising:
   a first interface for communicatively coupling said solid state memory drive with a solid state memory cartridge; and
   a second interface for communicatively coupling the solid state memory drive with a host system through a drive bay in said host system, wherein said drive bay is configured to house a cassette tape drive, and
   wherein said solid state memory drive is configured to communicatively couple with the host system through said second interface by emulating said cassette tape drive such that said solid state memory drive is operable to use a drive management software of said cassette tape drive, wherein said drive management software is configured to transfer data between said host system and a cassette tape.

2. The drive of claim 1, further comprising a housing sized to fit within said drive bay that is also configured to house said cassette tape drive.

3. The drive of claim 1, further comprising a mechanism configured to displace a cover on said solid state memory cartridge when inserted into said solid state memory drive so as to expose an interface on said cartridge for mating with said first interface of said solid state memory drive.

4. A solid state memory system comprising:
   a solid state memory drive comprising:
      a first interface for communicatively coupling said solid state memory drive with a solid state memory cartridge; and
      a second interface for communicatively coupling the solid state memory drive with a host system through a drive bay configured to house a cassette tape drive; and
   a host system comprising at least one drive bay configured to receive either said solid state memory drive or a cassette tape drive,
   wherein said solid state memory drive is configured to communicatively couple with the host system through said second interface by emulating said cassette tape drive such that said solid state memory drive is operable to use a drive management software of said cassette tape drive, wherein said drive management software is configured to transfer data between said host system and a cassette tape.

5. The system of claim 4, further comprising said drive management software on said host system configured to transfer data between said solid state memory drive and said host system.

6. The system of claim 5, wherein said drive management software is configured to transfer data to and from said cassette tape drive.

7. The system of claim 5, wherein a graphical user interface of a drive management software for said solid state memory drive is configured to match a graphical user interface of said drive management software for said cassette tape drive.

8. The system of claim 4, wherein said solid state memory drive further comprises a mechanism configured to displace a cover on said solid state memory cartridge when inserted into said solid state memory drive so as to expose an interface on said cartridge for mating with said first interface of said solid state memory drive.

9. The system of claim 4, further comprising said solid state memory cartridge comprising an interface for communicatively coupling to said first interface.

10. The system of claim 4, wherein said solid state memory cartridge comprises a plurality of solid state memory devices housed in a cartridge housing.

11. The system of claim 4, wherein said solid state memory cartridge is sized to fit into a rack designed to hold cassette tapes.

12. A method for storing electronic data, the method comprising:
    emulating, by a solid state memory cartridge drive, a cassette tape drive such that said solid state memory cartridge drive is operable to use a drive management software of said cassette tape drive to communicatively interface said solid state memory cartridge drive and a host system, wherein said solid state memory cartridge drive comprises a first interface for communicatively coupling said solid state memory cartridge drive with a solid state memory cartridge, and a second interface for communicatively coupling said solid state memory cartridge drive with said host system through at least one drive bay in said host system, wherein the at least one drive bay is configured to house either said solid state memory cartridge drive or said cassette tape drive.

13. The method of claim 12, further comprising transferring data between said host system and said solid state memory cartridge interfaced with said solid state memory cartridge drive.

14. The method of claim 12, further comprising displacing a cover on said solid state memory cartridge when inserted into said solid state memory cartridge drive so as to expose an interface on said cartridge for mating with said first interface of said solid state memory cartridge drive.

15. The method of claim 12, wherein a drive management software for said solid state memory cartridge drive comprises a graphical user interface configured to match a graphical user interface of said drive management software for said cassette tape drive.

16. The method of claim 12, wherein a plurality of solid state memory cartridges for use with said host system are racked using a rack originally designed to accommodate cassette tapes.

17. The method of claim 12, wherein data currently stored on cassette tapes through said cassette tape drive is transferred to any number of said solid state memory cartridges.

18. The method of claim 17, wherein routine archiving operations are resumed with said solid state memory cartridge drive.

* * * * *